(12) United States Patent
Shimada et al.

(10) Patent No.: US 9,620,442 B2
(45) Date of Patent: Apr. 11, 2017

(54) SEMICONDUCTOR DEVICE

(71) Applicant: KABUSHIKI KAISHA TOSHIBA, Tokyo (JP)

(72) Inventors: Eiji Shimada, Kawasaki Kanagawa (JP); Gentaro Ookura, Kawasaki Kanagawa (JP); Hiroyuki Inagi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/298,075

(22) Filed: Oct. 19, 2016

(65) Prior Publication Data

US 2017/0040245 A1 Feb. 9, 2017

Related U.S. Application Data

(62) Division of application No. 14/635,938, filed on Mar. 2, 2015.

(30) Foreign Application Priority Data

Sep. 12, 2014 (JP) ................ 2014-186703

(51) Int. Cl.
*H01L 21/56* (2006.01)
*H01L 23/31* (2006.01)
*H01L 23/495* (2006.01)

(52) U.S. Cl.
CPC .... *H01L 23/49568* (2013.01); *H01L 23/3107* (2013.01)

(58) Field of Classification Search
None
See application file for complete search history.

(56) References Cited

U.S. PATENT DOCUMENTS

| 5,055,912 | A | 10/1991 | Murasawa et al. |
| 5,334,872 | A | 8/1994 | Ueda et al. |
| 5,399,416 | A | 3/1995 | Bujard |
| 7,728,411 | B2 * | 6/2010 | Lee .................. H01L 23/49503 257/666 |
| 8,203,848 | B2 * | 6/2012 | Takakusaki .......... H05K 1/0203 257/696 |
| 2008/0119065 | A1 | 5/2008 | Takakusaki et al. |

(Continued)

FOREIGN PATENT DOCUMENTS

| JP | H05175406 A | 7/1993 |
| JP | H05-206361 A | 8/1993 |

(Continued)

*Primary Examiner* — Thao P Le
(74) *Attorney, Agent, or Firm* — Patterson & Sheridan, LLP

(57) ABSTRACT

A semiconductor device includes a package part having a semiconductor element sealed in resin, a plurality of first leads each having an outer portion extending from a first side of the package part, and a plurality of second leads each having an outer portion extending from a second side of the package part. A combined bottom surface area of the outer portions of the plurality of first leads is greater than a combined bottom surface area of the outer portions of the plurality of second leads. The semiconductor device also includes a heat dissipation plate provided on the bottom surface of the package part and connected to at least one of the plurality of second leads.

20 Claims, 18 Drawing Sheets

(56) References Cited

U.S. PATENT DOCUMENTS

| | | | |
|---|---|---|---|
| 2008/0298063 A1 | 12/2008 | Hayashi | |
| 2013/0003312 A1* | 1/2013 | Stella | H01L 23/3672 361/719 |
| 2015/0221582 A1* | 8/2015 | Miyakawa | H01L 23/49524 257/676 |

FOREIGN PATENT DOCUMENTS

| | | |
|---|---|---|
| JP | H06196611 A | 7/1994 |
| JP | 2004087998 A | 3/2004 |
| JP | 2007281122 A | 10/2007 |

\* cited by examiner

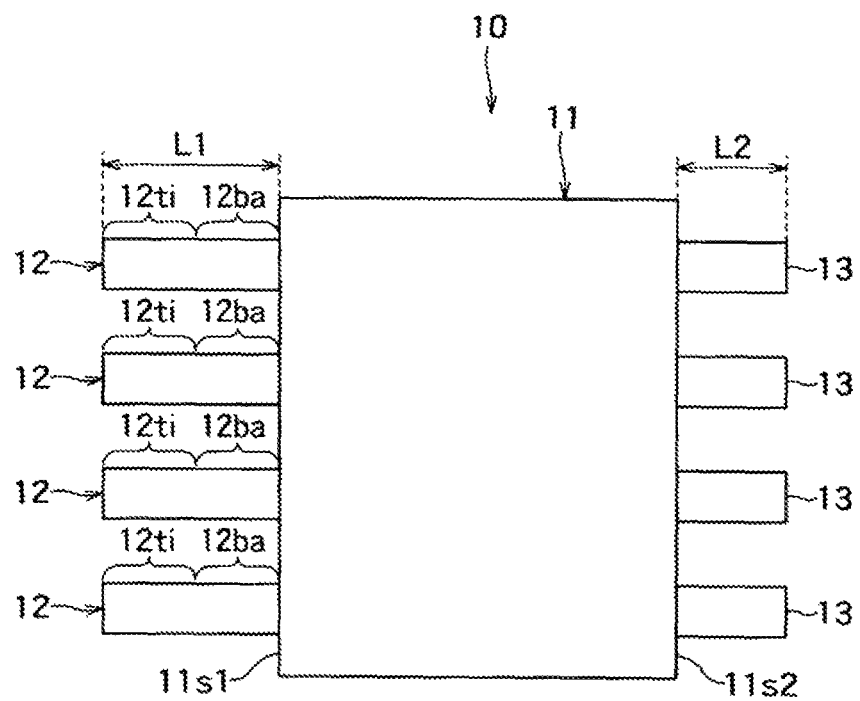

(COMPARATIVE EXAMPLE)

(COMPARATIVE EXAMPLE)

(COMPARATIVE EXAMPLE)

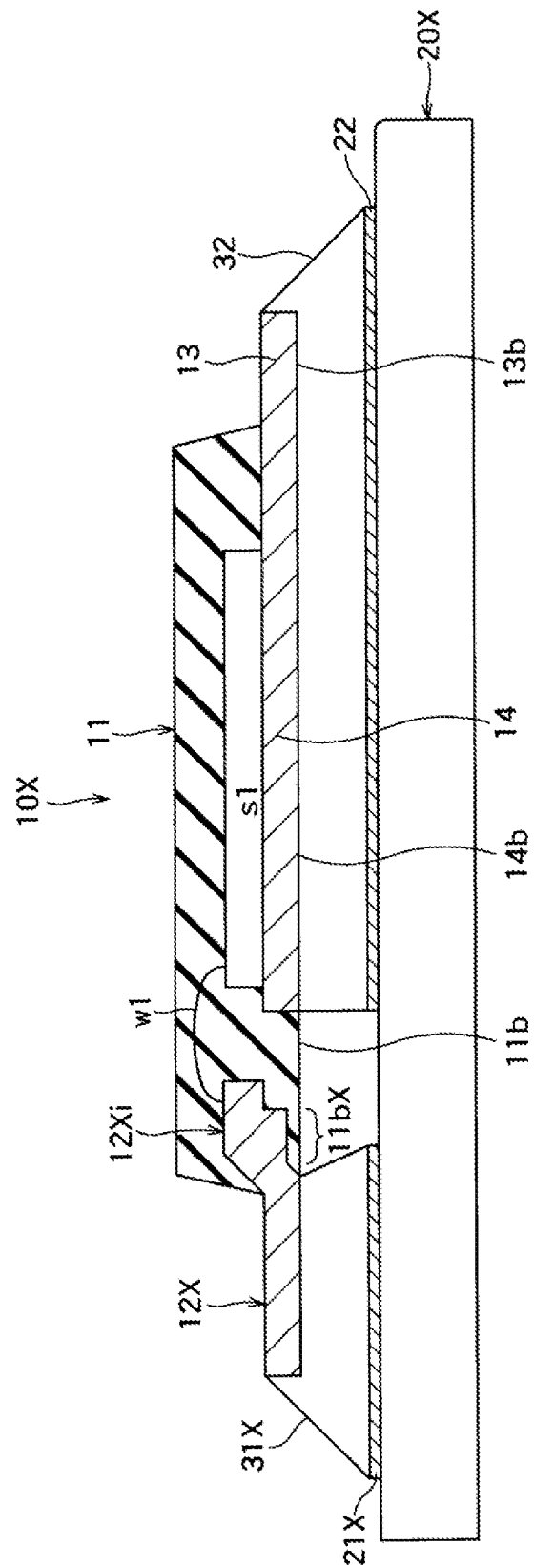
FIG. 13 (COMPARATIVE EXAMPLE)

U.S. 9,620,442 B2

SEMICONDUCTOR DEVICE

CROSS-REFERENCE TO RELATED APPLICATIONS

This application is a division of U.S. patent application Ser. No. 14/635,938, filed on Mar. 2, 2015, which claims the benefit of priority from Japanese Patent Application No. 2014-186703, filed Sep. 12, 2014, the entire contents of which are incorporated herein by reference.

FIELD

Embodiments described herein relate generally to a semiconductor device.

BACKGROUND

A surface-mounting type semiconductor device (semiconductor package) in which a power MOSFET or other semiconductor element is sealed with a resin is known. In the semiconductor device of this type, the leads used are flat leads and a heat dissipation plate is often provided on the rear surface of the semiconductor device. When the semiconductor device is mounted on a substrate, the heat dissipation plate is soldered onto the substrate together with the leads. Soldering both of these elements allows space saving to be achieved and also high heat dissipation properties to be obtained. In such a configuration, when a heat cycling is applied over a long period of time, a large stress is generated due to differences of the thermal expansion between the semiconductor device and the substrate. Therefore, there is a concern with the occurrence of solder cracks.

DESCRIPTION OF THE DRAWINGS

FIG. 1A is a top view of a semiconductor device according to a first embodiment.

FIG. 13 is a cross-sectional view illustrating the semiconductor device of the comparative example of FIGS. 3A and 3B mounted on the substrate.

DETAILED DESCRIPTION

Figure 1B:
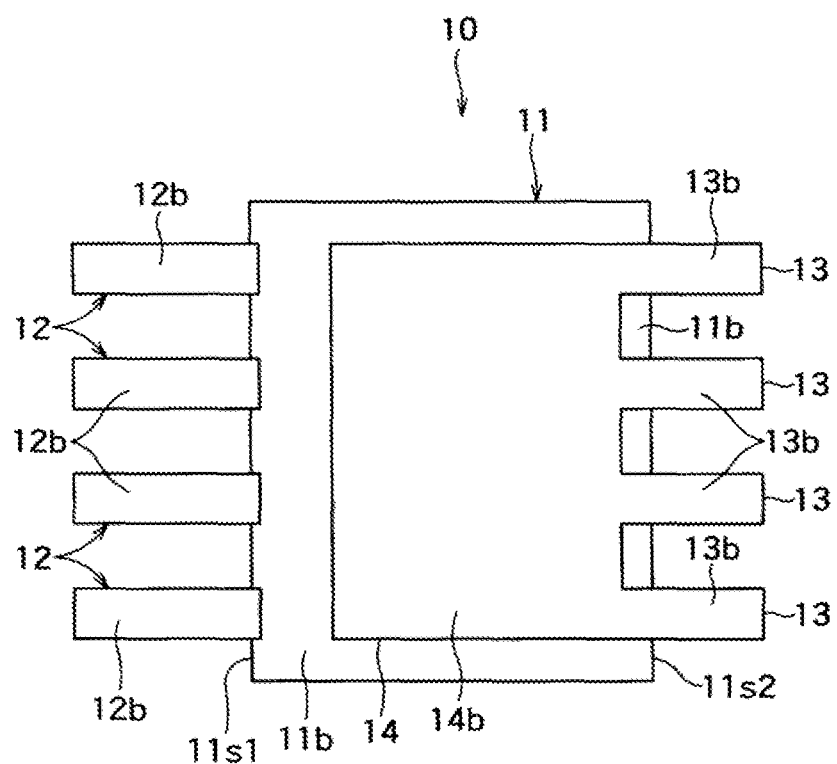
FIG. 1B is a bottom view of the semiconductor device illustrated in FIG. 1A.

An exemplary embodiment provides a semiconductor device capable of suppressing the occurrence of solder cracks.

In general, according to one embodiment, a semiconductor device is provided. The semiconductor device includes a package part having a semiconductor element sealed in a resin, a plurality of first leads each having an outer portion extending from a first side of the package part, and a plurality of second leads each having an outer portion extending from a second side of the package part. The outer portions of the plurality of first leads have a combined bottom surface area that is greater than a combined bottom surface area of the outer portions of the plurality of second leads. The semiconductor device also includes a heat dissipation plate provided on the bottom surface of the package part and connected to at least one of the plurality of second leads.

Hereinafter, exemplary embodiments will be described with reference to the drawings. The present disclosure is not limited to the example embodiments. In the drawings in the disclosure, to facilitate the illustration and the ease of understanding, an appropriate scale, aspect ratio and the like are changed and exaggerated from those of the actual device.

First Embodiment

FIG. 1A is a top view of a semiconductor device 10 according to a first embodiment, and FIG. 1B is a bottom view of the semiconductor device 10 illustrated in FIG. 1A.

As illustrated in FIGS. 1A and 1B, the semiconductor device 10 is a surface-mounting type and includes a package part (resin package) 11, a plurality of first leads 12, a plurality of second leads 13, and a heat dissipation plate 14. The semiconductor device 10 may be referred to as a heat sink small outline package (HSOP) type package.

The package part 11 has, for example, a substantially rectangular parallelepiped shape and a semiconductor element is sealed therein with resin. For example, the semiconductor element is a power metal oxide semiconductor field effect transistor (MOSFET).

The first leads 12 protrude from a first side 11s1 of the package part 11. Bottom surfaces 12b of each first lead 12 are substantially flush with a bottom surface 11b of the package part 11. That is, the first leads 12 are flat leads. The first leads 12 are disposed at substantially equal intervals between adjacent first leads 12. Each first lead 12 includes a tip end side portion 12ti on the side closer to the tip end of the first lead 12, that is, on the side of the first lead 12 away from the first side 11s1. Each first lead 12 also includes and a root side portion 12ba on the side of the first lead 12 closer to the first side 11s1. Each first lead 12 is formed continuously from the tip end side portion 12ti to the package part 11.

The second leads 13 protrude from a second side surface 11s2 opposite to the first side 11s1 of the package part 11. Bottom surfaces 13b of each second lead 13 are substantially flush with the bottom surface 11b of the package part 11. That is, the second leads 13 are flat leads. The second leads 13 are disposed at substantially equal intervals between adjacent second leads 13.

The heat dissipation plate 14 is provided on the bottom surface 11b of the package part 11 and is connected to the second leads 13. The heat dissipation plate 14 is integrally formed with the second leads 13—that is, heat dissipation plate 14 and the second leads 13 are, for example, formed from a single metal plate. A bottom surface 14b of the heat dissipation plate 14 is substantially flush with the bottom surfaces 13b of the second leads 13 and the bottom surface 11b of the package part 11. The heat dissipation plate 14 dissipates heat of the semiconductor element sealed with resin. In some embodiments, the heat dissipation plate 14 may be connected to at least one of the second leads 13.

A length L1 of the first leads 12 extending from the package part 11 is longer than a length L2 of the plural second leads 13 extending from the package part 11. For example, the length L1 may be about two times larger than the length L2. The length L1 is a length from the first side 11s1 of the package part 11 to the tip end of the first lead 12. The length L2 is a length from the second side 11s2 of the package part 11 to the tip end of the second lead 13. The extra length of the first leads 12 allows the bottom surfaces of the portions of the first leads 12 extending from the first side 11s1 to have a greater combined surface area than the bottom surfaces of the portions of the second leads 13 extending from the second side 11s2. For example, the combined surface area of the bottom surfaces of the portions of the first leads extending from the first side may be about two times larger than the combined surface area of the bottom surfaces of the portions of the second leads extending from the second side.

When the semiconductor element is a power MOSFET, the plural second leads 13 and the heat dissipation plate 14 may be connected to a drain electrode of the power MOSFET.

Figure 2:
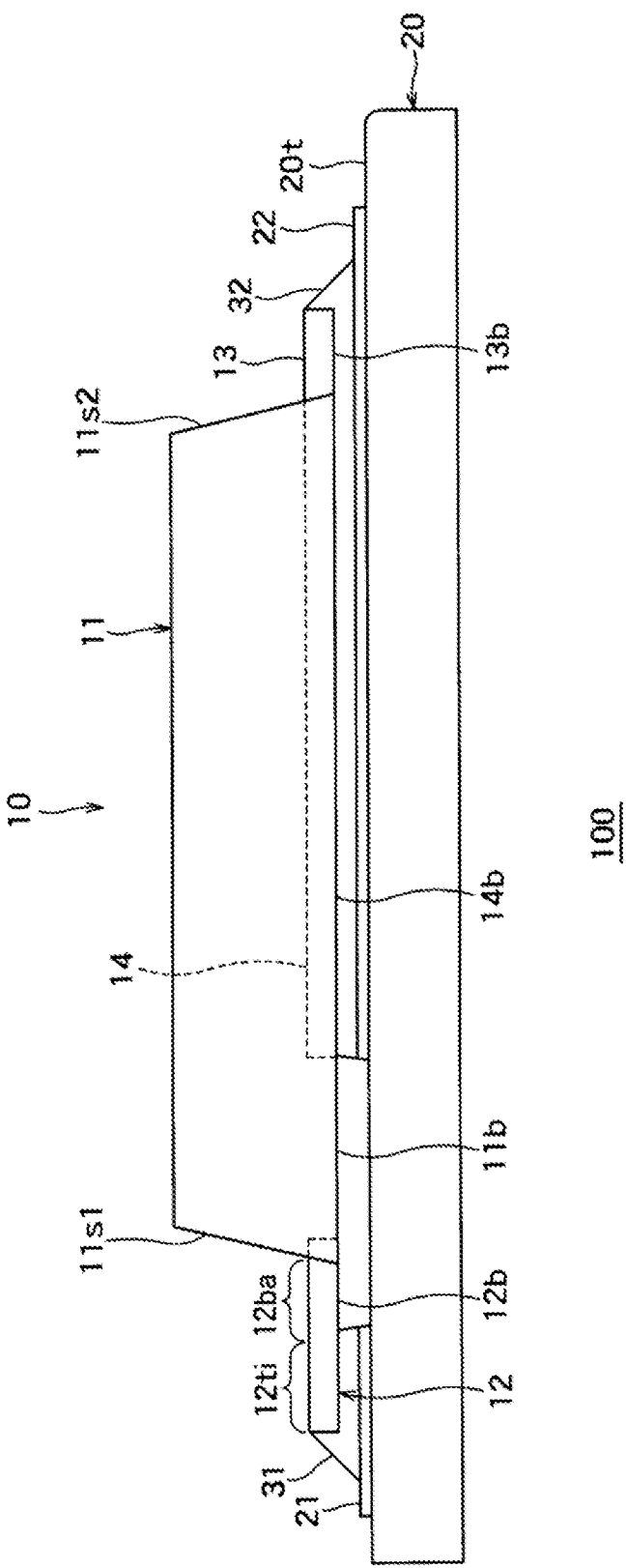
FIG. 2 is a side view illustrating the semiconductor device illustrated in FIGS. 1A and 1B mounted on a substrate.

FIG. 2 is a side view of an electronic apparatus 100 in which the semiconductor device 10 illustrated in FIGS. 1A and 1B is mounted on a substrate 20. In FIG. 2, the semiconductor device 10 is viewed from a side surface on which the first and second leads 12 and 13 of the package part 11 are not provided. As illustrated in FIG. 2, the electronic apparatus 100 includes the semiconductor device 10, the substrate 20, and solders 31 and 32.

The substrate 20 includes a first landing 21 and a second landing 22 provided on a surface 20t on the side closer to the semiconductor device 10. The first landing 21 faces the tip end side portion 12ti of the first lead 12 with the solder 31 provided therebetween. The first landing 21 does not face the root side portion 12ba of the first lead 12, and solder 31 does not contact the root side portion 12ba. The second landing 22 faces both the second lead 13 and the heat dissipation plate 14 with the solder 32 provided therebetween.

The solder 31 is provided between the bottom surface 12b of the tip end side portion 12ti of the first lead 12 and the first landing 21 so as to electrically and mechanically connect the bottom surface of the tip end side portion 12ti of the first lead 12 with the first landing 21. The solder 31 is not provided between the root side portion 12ba of the first lead 12 and the substrate 20.

The solder 32 is provided between the second lead 13 and the second landing 22 and also provided between the heat dissipation plate 14 and the second landing 22 to connect the second lead 13 and the heat dissipation plate 14 with the second landing 22. The solders 31 and 32 are, for example, lead-free solders.

Here, for comparison, a semiconductor device 10X of a comparative example will be described.

Figure 3A:
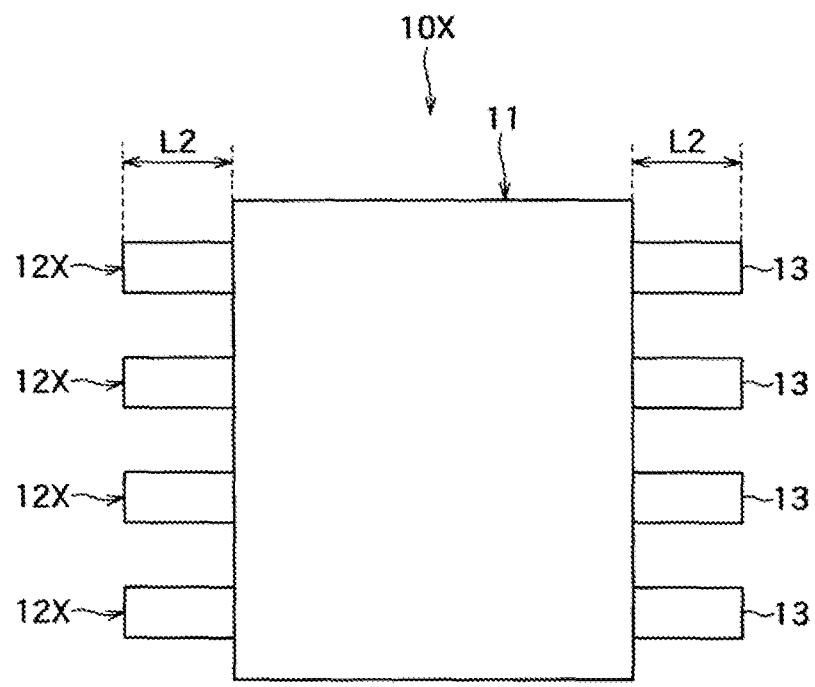
FIG. 3A is a top view of a semiconductor device of a comparative example.
Figure 3B:
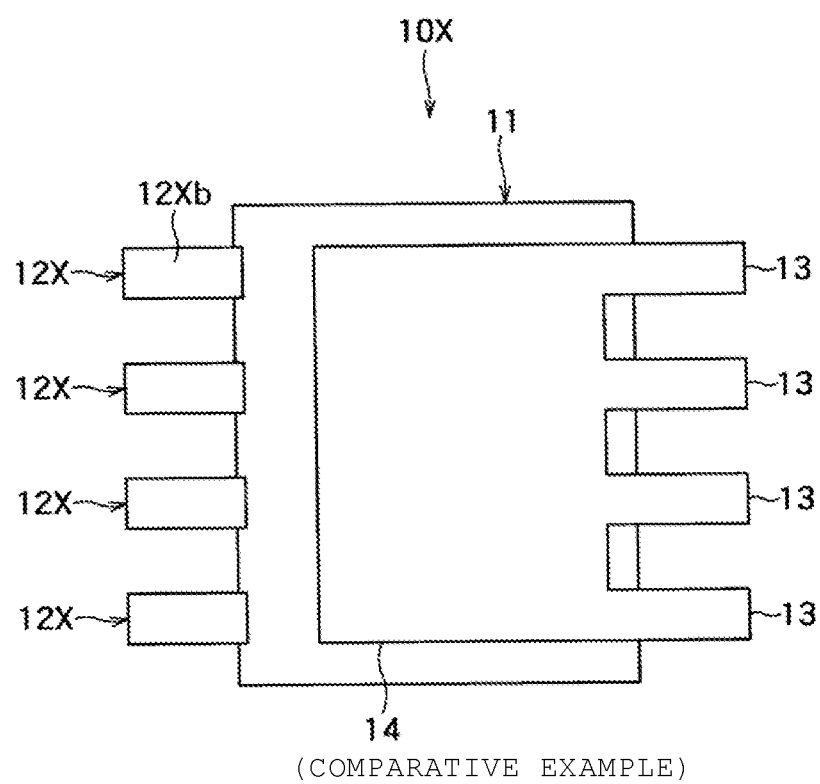
FIG. 3B is a bottom view of the semiconductor device illustrated in FIG. 3A.
Figure 4:
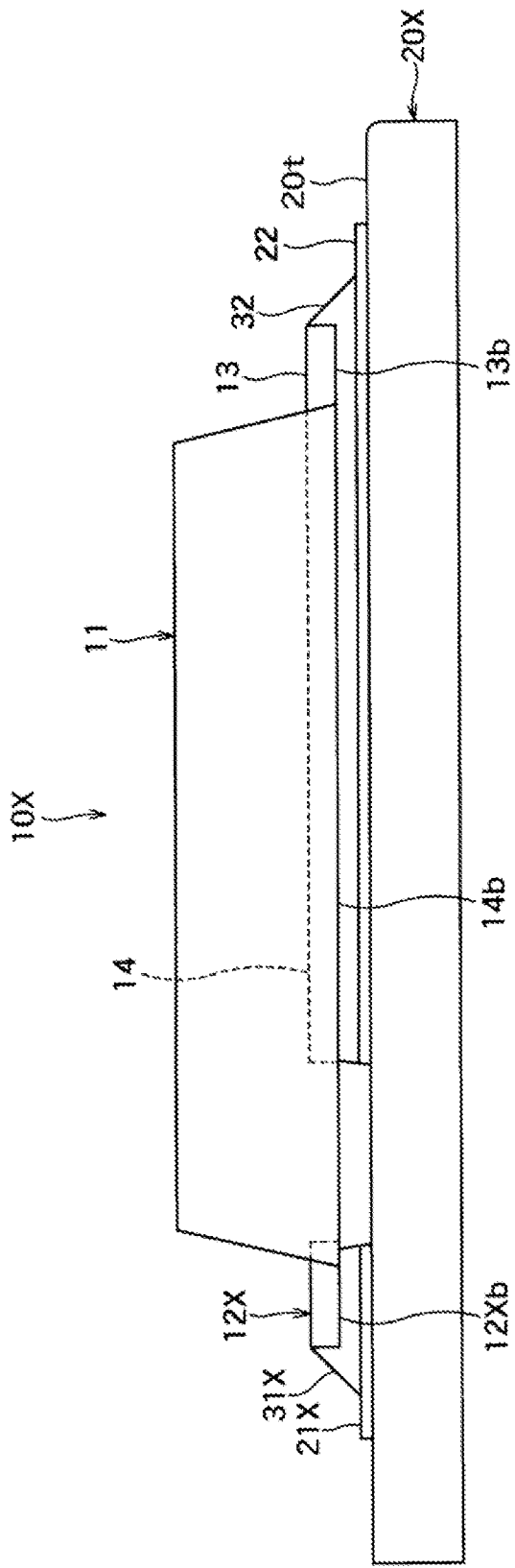
FIG. 4 is a side view illustrating the semiconductor device illustrated in FIGS. 3A and 3B mounted on a substrate.

FIG. 3A is a top view of a semiconductor device 10X according to a comparative example, and FIG. 3B is a bottom view of the semiconductor device 10X illustrated in FIG. 3A. FIG. 4 is a side view illustrating a state in which the semiconductor device 10X illustrated in FIGS. 3A and 3B is mounted on a substrate 20X. In FIGS. 3A to 4, same reference numbers refer to common components in FIGS. 1A to 2 and differences will be mainly described below.

As illustrated in FIGS. 3A and 3B, the semiconductor device 10X according to the comparative example is different from the semiconductor device according to the first embodiment in that the length L1 of the first leads 12X is substantially the same as the length L2 of the second leads 13.

As illustrated in FIG. 4, a first landing 21X of the substrate 20X is provided so as to be opposite to the entire first lead 12X with a solder 31X interposed therebetween. The solder 31X connects the entire bottom surface 12Xb of the first lead 12X with the first landing 21X.

In such a configuration, when a heat cycle in which the temperature is repeatedly changed from a low temperature (for example, −40° C. or lower) to a high temperature (for example, 100° C. or higher) is applied for a long period of time, stress is repeatedly generated due to the difference of the thermal expansion coefficient between the semiconductor device 10X and the substrate 20X and the stress is particularly applied to the first leads 12X. The inventors of this disclosure have found that the highest stress is applied particularly to two outermost first leads 12X among the first leads 12X. As a result, since force is applied to an interface between the first lead 12X and the solder 31X, cracks easily occur in the solder 31X. For example, cracks occur on the side closer to the package part 11 or on the side closer to the tip end of the first lead 12X, which is provided between the bottom surface 12Xb of the first lead 12X and the solder 31X. Such cracks easily occur when a lead-free solder is used.

On the other hand, since the second lead 13 is soldered onto the substrate 20 together with the heat dissipation plate 14 in a relatively large area, the second lead is not easily affected by stress. Accordingly, as compared to the solder 31X, solder 32 cracks less easily.

When cracks occur, the electrical resistance between the lead (e.g., first lead 12x) and the landing (e.g., landing 21x) increases and the heat resistance of the semiconductor device 10X also increases.

As compared to such a comparative example, the length L1 of the first lead 12 is larger than the length L2 of the second lead 13 in the first embodiment, as illustrated in FIG. 2, and thus, after the tip end side portion 12ti of the first lead 12 is soldered so as to have the substantially same area as the soldered area of the first lead 12X of the comparative example, the root side portion 12ba of the first lead 12 may not be soldered. A solder-free gap may exist between the root-side portion and the substrate 20. Accordingly, when stress is applied to the first lead 12, the root side portion 12ba, which is not soldered, is bent so that the root side portion may absorb the stress. Thus, the stress applied to the solder 31 may be reduced. In addition, as compared to the comparison example, the soldering area of the first lead 12 does not need to be reduced, and thus, there is no concern regarding the joining strength between the solder 31 and the first lead 12 being deteriorated. Therefore, the occurrence of cracks in the solder 31 may be suppressed.

Second Embodiment

A second embodiment is different from the first embodiment in that a part of the first lead in the second embodiment is curved.

Figure 5A:
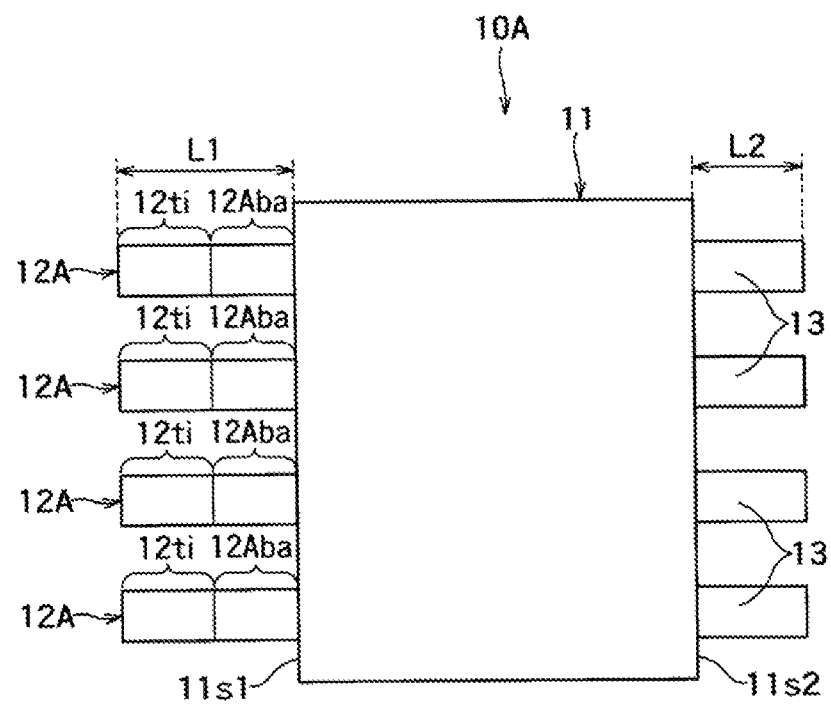
FIG. 5A is a top view of a semiconductor device according to a second embodiment.
Figure 5B:
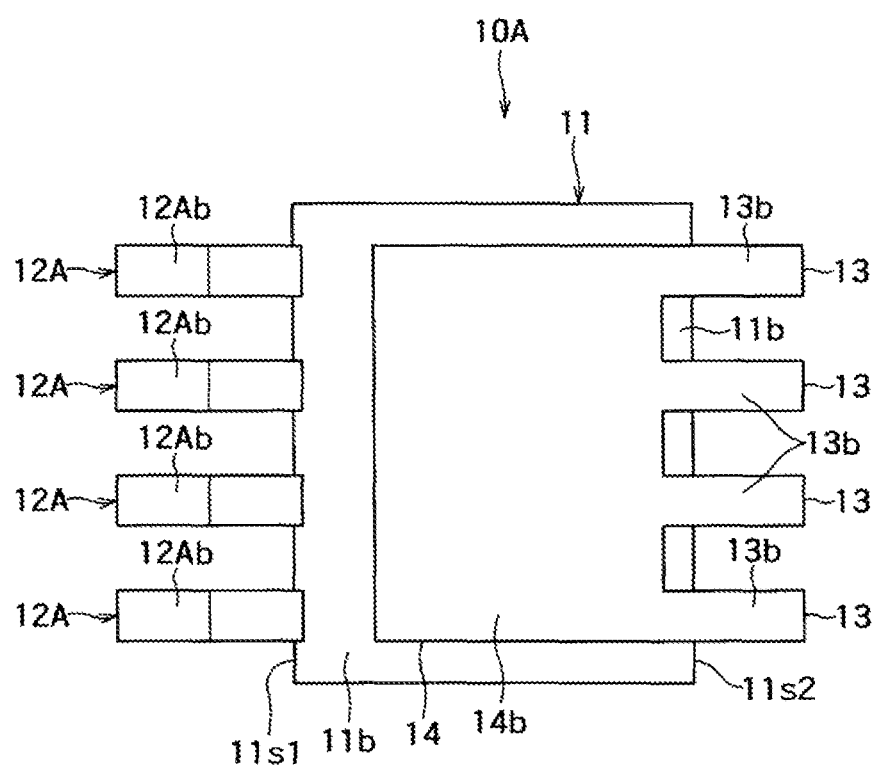
FIG. 5B is a bottom view of the semiconductor device illustrated in FIG. 5A.
Figure 6:
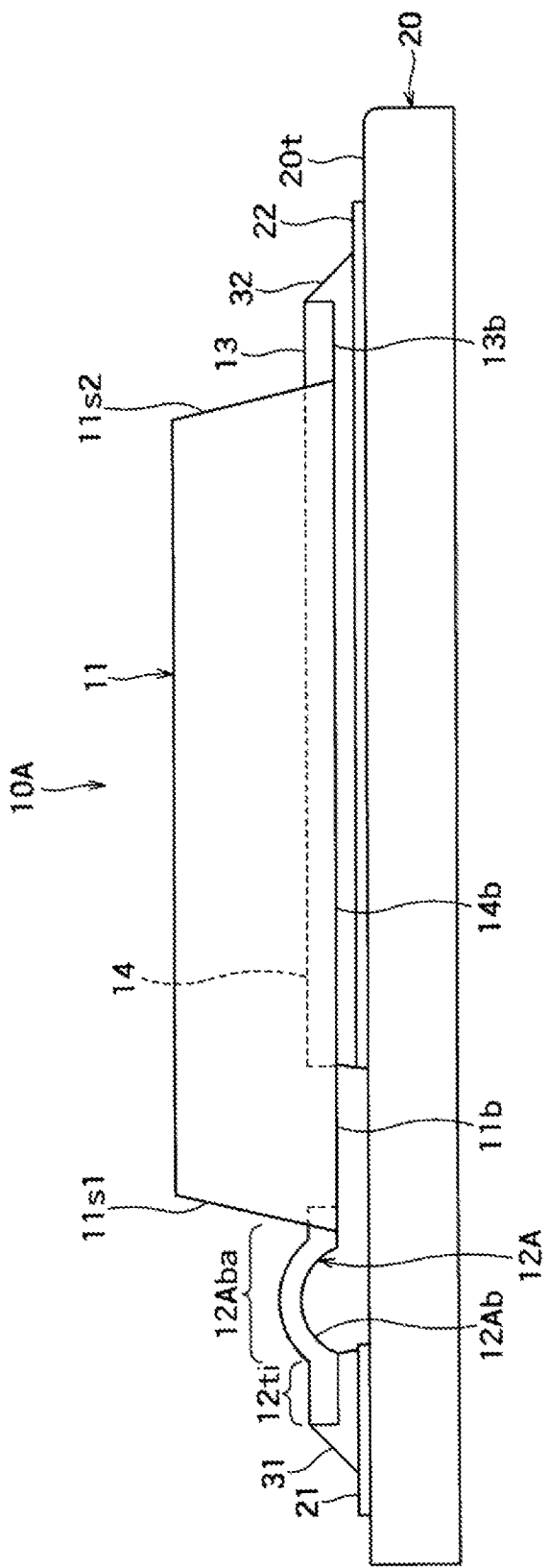
FIG. 6 is a side view illustrating the semiconductor device illustrated in FIGS. 5A and 5B mounted on a substrate.

FIG. 5A is a top view of a semiconductor device 10A according to a second embodiment, and FIG. 5B is a bottom view of the semiconductor device 10A illustrated in FIG. 5A. FIG. 6 is a side view illustrating the semiconductor device 10A of FIGS. 5A and 5B mounted on a substrate 20. In FIGS. 5A to 6, same reference numbers refer to common components in FIGS. 1A to 2 and differences will be mainly described below.

Each first lead 12A includes a bottom surface 12Ab, a tip end side portion 12ti on the side closer to the tip end of the first lead 12A, and a curved portion 12Aba closer to the package part 11. The curved portion 21Aba is curved and formed continuously from the tip end side portion 12ti to the first side 11s1 of the package part 11. The curved portion 12Aba functions as an elastic body. As illustrated in FIG. 6, the curved portion 12Aba of the first lead 12A curves from the first side 11s1 and then extending away from the substrate 20. That is, the curved portion 12Aba is curved to forma convex shape in a direction away from the substrate 20 when viewed from the side as shown in FIG. 6. At least part of the bottom surface of the tip end side portion 12ti of the first lead 12A is substantially flush with the bottom surface 11b of the package part 11. In this manner, since the curved portion 12Aba does not protrude past the bottom surface 11b of the package part 11 towards the substrate 20, the surface-mounting of the semiconductor device 10A is not affected by the curved portion 12Aba.

The length L1 of the first leads 12A is longer than the length L2 of the second leads 13. The length L1 may be the same as in the first embodiment.

By adopting such a configuration, in this second embodiment, the curved portion 12Aba of the first lead 12A is not soldered to the first landing 21 when the semiconductor device 10A is mounted to the substrate 20 as in the first embodiment. Accordingly, when stress is applied, the curved portion 12Aba, which is not soldered, can bend so that the curved portion 12Aba may absorb stress. The curved portion 12Aba can be more easily bent than the root side portion 12ba in the first embodiment. Accordingly, the stress applied to the solder 31 may be reduced more than in the first embodiment. Therefore, the occurrence of cracks in the solder 31 may be more effectively suppressed.

The shape of the curved portion 12Aba is not limited to the example illustrated in the drawing (FIG. 6) and two or more curved portions may be provided to form a convex shape in the direction away from the substrate 20.

Third Embodiment

A third embodiment is different from the first embodiment in that the width of at least some of the first leads is widened.

Figure 7A:
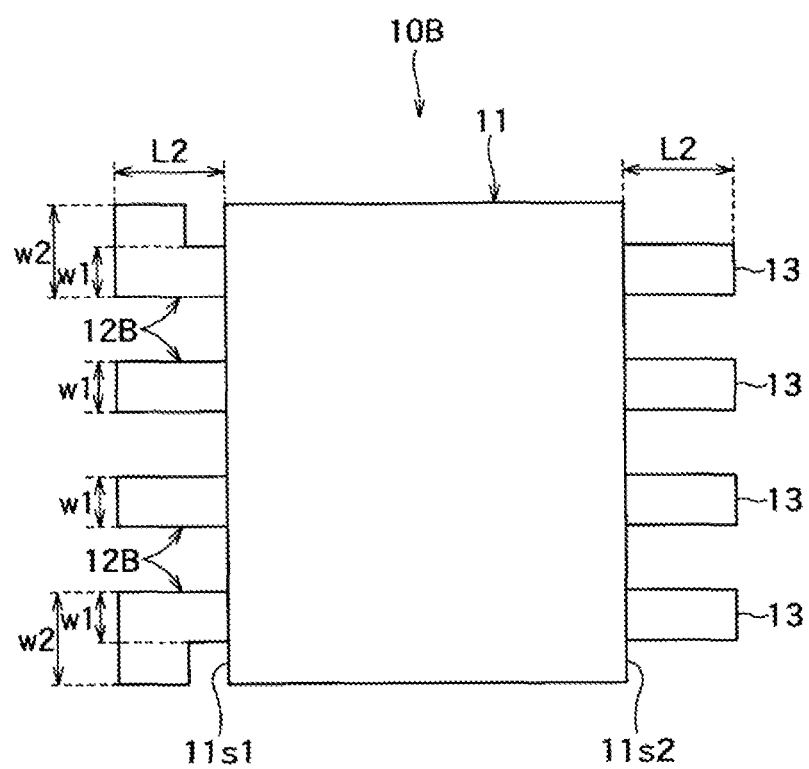
FIG. 7A is a top view of a semiconductor device according to a third embodiment.
Figure 7B:
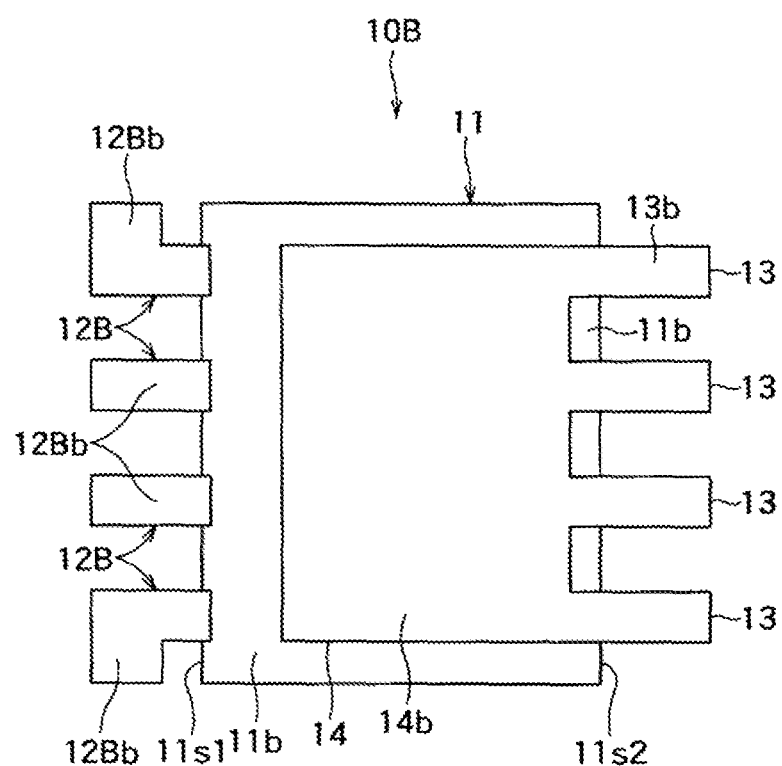
FIG. 7B is a bottom view of the semiconductor device illustrated in FIG. 7A.

FIG. 7A is a top view of a semiconductor device 10B according to a third embodiment, and FIG. 7B is a bottom view of the semiconductor device 10B illustrated in FIG. 7A. In FIGS. 7A and 7B, same reference numbers refer to common components in FIGS. 1A and 1B and differences will be mainly described below.

The first leads 12B protrude from the first side 11s1 of the package part 11 and bottom surfaces 12Bb of the first leads 12B are substantially flush with the bottom surface 11b of the package part 11. The first leads 12B are disposed at substantially equal intervals.

A width w2 of at least a part of two outermost first leads 12B is wider than a width w1 of the other first leads 12B. In the example illustrated in the FIGS. 7A and 7B, the width w2 on the side closer to the outer end of the two outermost first leads 12B is widened in a direction away from the other first leads 12B. The width w1 on the side of the two outermost first leads 12B closer to the package part 11 is substantially the same as the width w1 of other first leads 12B. For example, the width w2 may be about two times wider or more than the width w1.

The length L2 of the plural first leads 12B is substantially the same as the length L2 of the plural second leads 13.

However, by adopting such a configuration as illustrated in FIGS. 7A and 7B, the soldering area of the two outermost first leads 12B is increased in this third embodiment, thus the joining strength between the two outermost first leads 12B and the solders may be increased. Accordingly, the occurrence of solder cracks in the soldered portion may be suppressed. As described in the comparative example, since the strongest stress is applied to the two outermost first leads 12B, it is effective to suppress the occurrence of solder cracks in the soldered portion by using the configuration of the third embodiment.

Furthermore, since the width w2 of the two first leads 12B positioned on the outermost sides is widened in the direction in which other first leads 12B are not present and the width of the first leads 12B not positioned on the outermost sides among the plural first leads 12B is not widened, an interval between two adjacent first leads 12B is the same as in the comparative example, and thus there is no increased possibility of causing a short circuit between the two first leads 12B by the solder.

For the two outermost first leads 12B positioned on, the width on the side closer to the package part 11 may be wider than the width w1 of other first leads 12B and the width on the side closer to the outer end may be substantially the same as the width w1 of other first leads 12B.

Fourth Embodiment

In a fourth embodiment, the width of the second lead is also widened.

Figure 8:
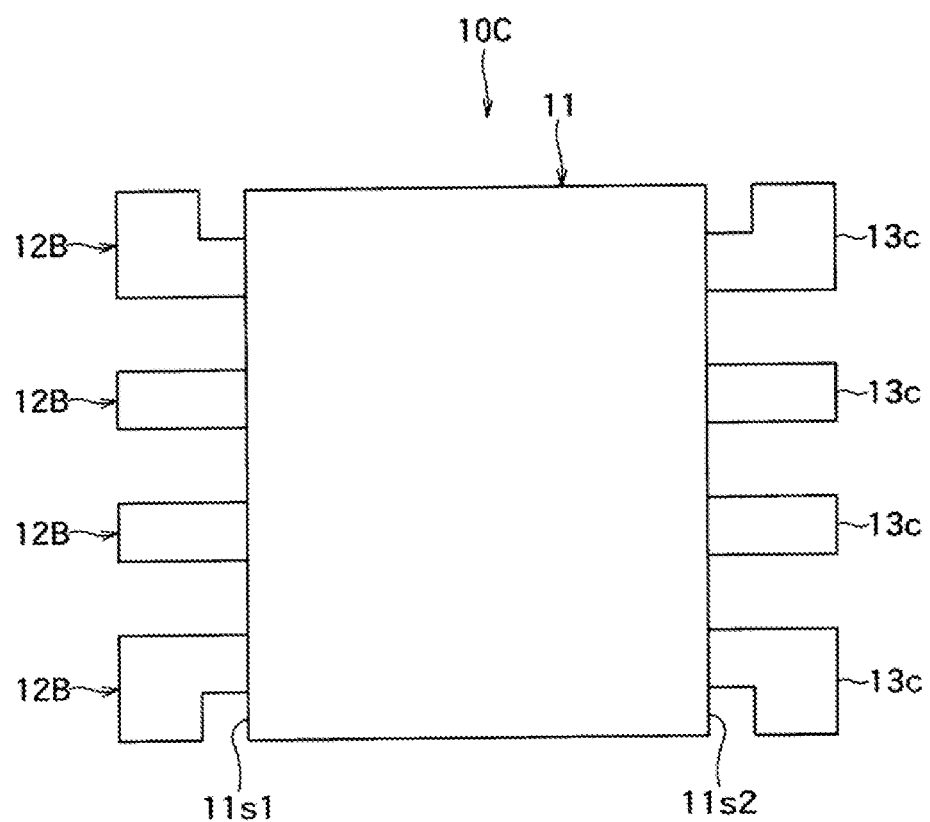
FIG. 8 is a top view of a semiconductor device according to a fourth embodiment.

FIG. 8 is a top view of a semiconductor device 10C according to a fourth embodiment. In FIG. 8, the same reference numbers refer to common components in FIGS. 7A and 7B and differences will be mainly described below.

As illustrated in FIG. 8, a width of at least a part of two outermost second leads 13C positioned is wider than a width of other second leads 13C.

By adopting such a configuration, since the soldering area of two outermost second leads 13C is increased as well as the soldering area of two outermost first leads 12B in the embodiment, the joining strength between the two outermost second leads 13C and the solders may be increased. Accordingly, the occurrence of solder cracks in the soldered portion may be suppressed. As described in the comparative example, since the second leads 13C are integrally formed with the heat dissipation plate 14, the second leads are not easily affected by the stress. However, the second leads may be even less easily affected by the stress by adopting the configuration according to this embodiment.

Fifth Embodiment

In a fifth embodiment, the width of the entire two outermost first leads is widened.

Figure 9:
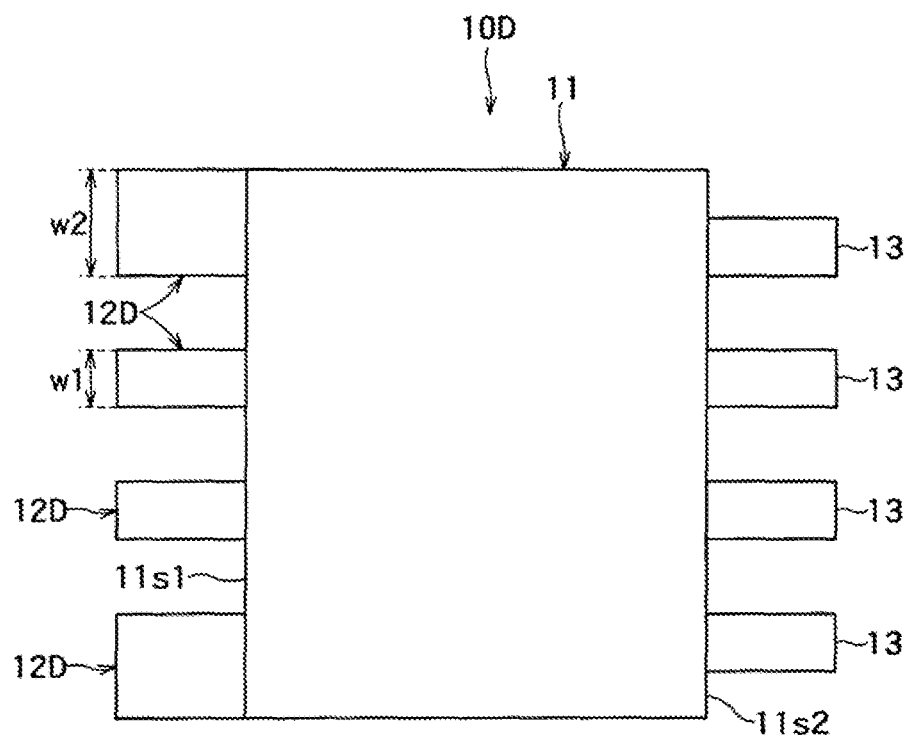
FIG. 9 is a top view of a semiconductor device according to a fifth embodiment.

FIG. 9 is a top view of a semiconductor device 10D according to a fifth embodiment. In FIG. 9, the same reference numbers refer to common components in FIGS. 7A and 7B and differences will be mainly described.

The width w2 of the two outermost first leads 12D is wider than the width w1 of other first leads 12D. The two outermost first leads 12D have the width w2 for entire length of each outermost first lead 12D from the first side 11s1 to the outer end of the lead 12D.

By adopting such a configuration, since the soldering area of the two outermost first leads 12D may be even further increased in this embodiment, as compared to the third embodiment, the joining strength between the two outermost first leads 12D and the solders may be increased. Therefore, the occurrence of solder cracks in the soldered portion may be suppressed further.

In some embodiments, the width of the two outermost second leads 13 may be also wider than the width of other second leads 13 for the entire length of the two outermost second leads 13.

Sixth Embodiment

A sixth embodiment relates to a semiconductor device in which the first embodiment and the third embodiment are combined.

Figure 10:
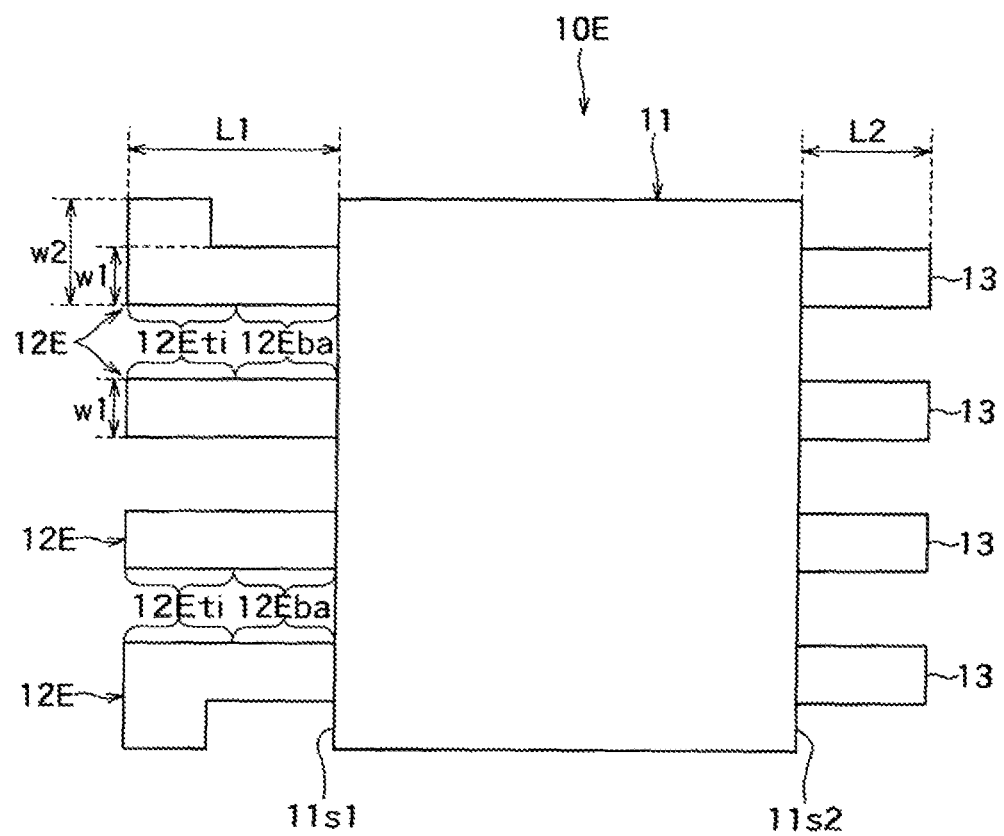
FIG. 10 is a top view of a semiconductor device according to a sixth embodiment.

FIG. 10 is a top view of a semiconductor device 10E according to a sixth embodiment. In FIG. 10, same reference numbers refer to common components in FIGS. 7A and 7B and differences will be mainly described below.

The width w2 of at least a part of two first leads 12E positioned on the outermost sides among plural first leads 12E is wider than the width w1 of other first leads 12E. In the two first leads 12E positioned at the outermost sides, the width w2 of the tip end side portion 12Eti is wider than the width w1 of the root side portion 12Eba.

Further, the length L1 of the plural first leads 12E is larger than the length L2 of the plural second leads 13.

By adopting such a configuration, both the effect of the first embodiment and the effect of the third embodiment may be obtained in this embodiment. That is, since the soldering area of the tip end side portions 12Eti of the two outermost first leads 12E is increased, the solder joining strength in the soldered portion may be increased. In addition, the root side portion 12Eba of the first lead 12E does not need to be soldered. Accordingly, stress may be absorbed by bending the root side portion 12Eba which is not soldered. Therefore, the occurrence of solder cracks may be suppressed even more effectively than in the first and third embodiments.

Seventh Embodiment

In a seventh embodiment, inner first leads are exposed from the bottom surface of the package part.

Figure 11A:
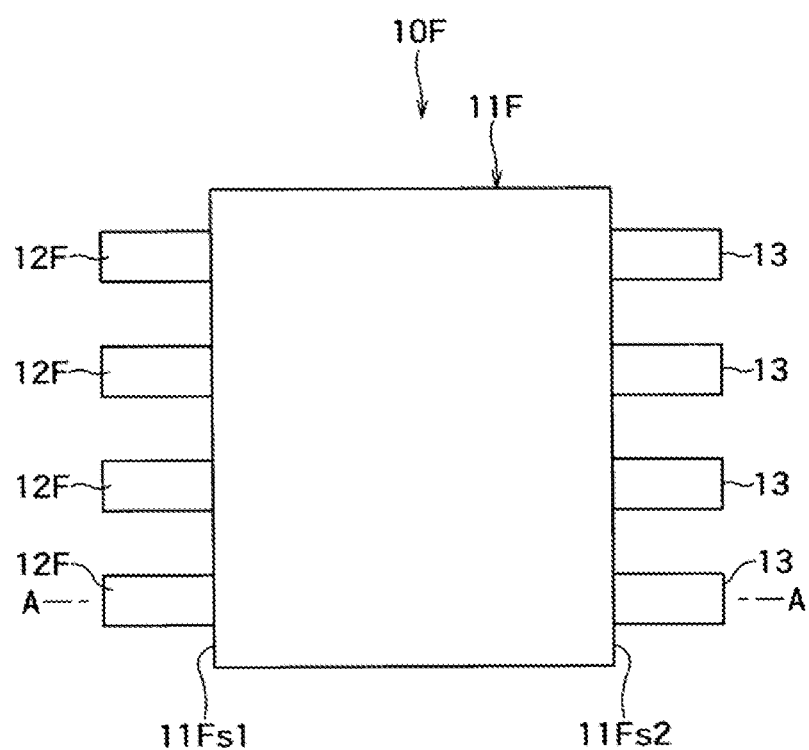
FIG. 11A is a top view of a semiconductor device according to a seventh embodiment.
Figure 11B:
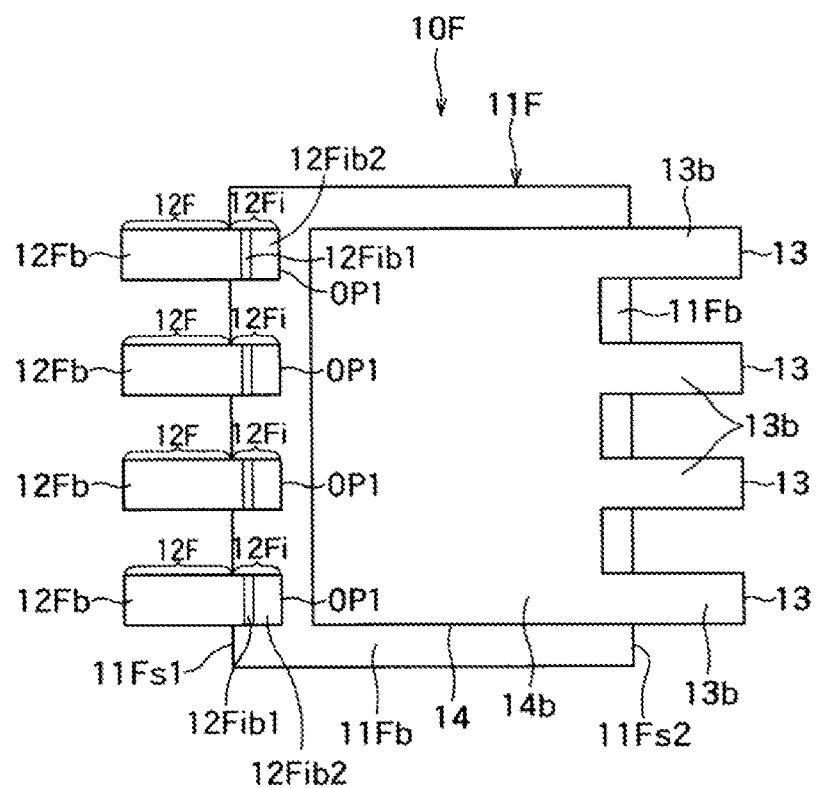
FIG. 11B is a bottom view of the semiconductor device illustrated in FIG. 11A.
Figure 12:
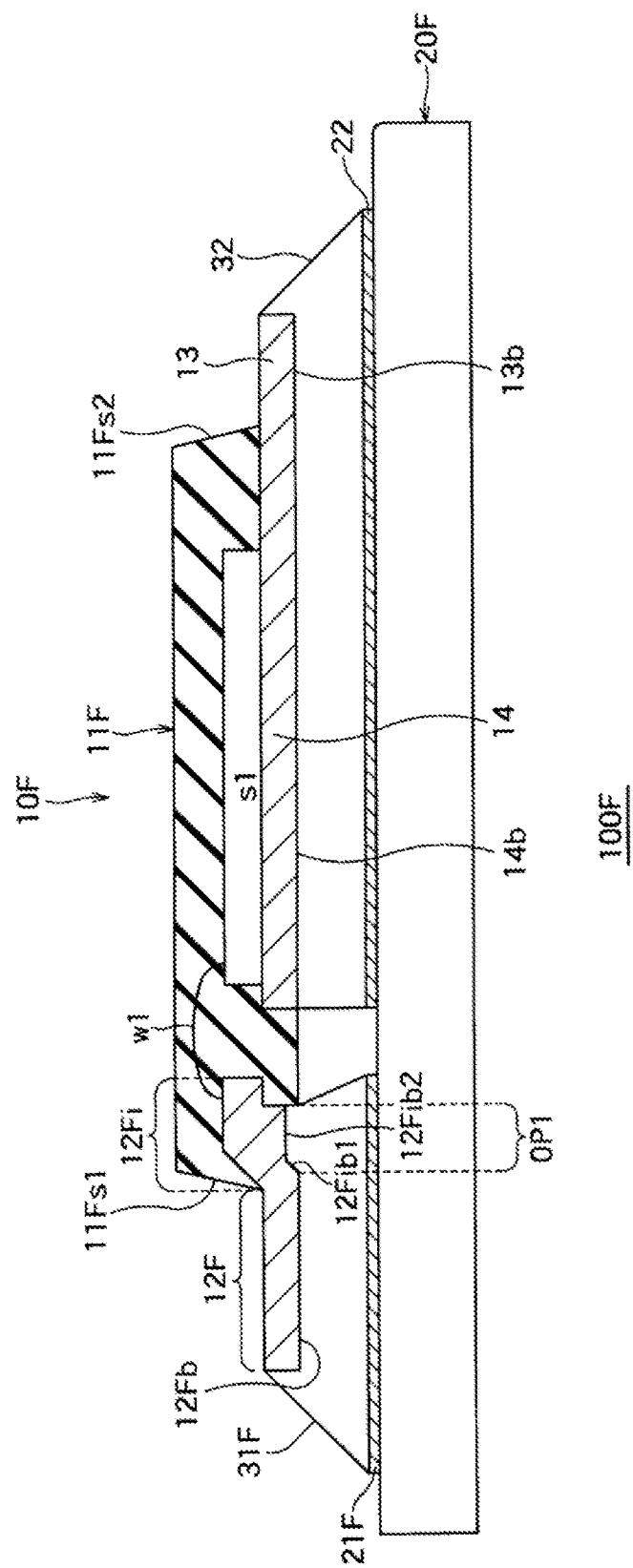
FIG. 12 is a cross-sectional view illustrating the semiconductor device illustrated in FIGS. 11A and 11B mounted on a substrate.

FIG. 11A is a top view of a semiconductor device 10F according to a seventh embodiment, and FIG. 11B is a bottom view of the semiconductor device 10F illustrated in FIG. 11A. FIG. 12 is a cross-sectional view illustrating the semiconductor device 10F of FIGS. 11A and 11B mounted on a substrate 20F. FIG. 12 corresponds to a cross section taken along the line A-A of the semiconductor device 10F illustrated in FIG. 11A. In FIGS. 11A to 12, same reference numbers refer to common components in FIGS. 1A to 2 and differences will be mainly described below.

As illustrated in FIG. 11A, when the semiconductor device 10F is viewed from the top surface, the external shape is the same as the external shape of the semiconductor device 10X according to the comparative example of FIG. 3A.

As illustrated in FIGS. 11B and 12, the semiconductor device 10F includes a plurality of first leads 12F. Each first lead 12F includes an inner first lead 12Fi that extends into an opening OP1 of the package part 11F. Each inner first lead 12Fi is adjacent to a first lead 12F and adjacent to a bottom surface 11Fb of the package part 11F, and are formed continuously from the first leads 12F. Each of the inner first leads 12Fi is formed continuously from a bottom surface 12Fb of each of the first leads 12F and has a bottom surface 12Fib1 that is elevated from the bottom surface 12Fb to the bottom surface 12Fib2 that is formed continuously from the bottom surface 12Fib1 and parallel with the bottom surface 12Fb. That is, the bottom surface 12Fib2 of the inner first lead 12Fi is positioned further in the package part 11F than the bottom surface 12Fb of the first lead 12F.

As illustrated in FIG. 12, a semiconductor element S1 is provided on the heat dissipation plate 14 surrounded by the package part 11F. The semiconductor element S1 and the inner first lead 12Fi are connected with a wire w1.

A first landing 21F of the substrate 20F is provided to face the first lead 12F and the inner first lead 12Fi with a solder 31F interposed therebetween.

The solder 31F is provided between the first lead 12F and the first landing 21F and between the inner first lead 12Fi and the first landing 21F so as to electrically and mechanically connect the first lead 12F and the inner first lead 12Fi with the first landing 21F.

Here, for comparison, the cross section of the semiconductor device 10X of the above-described comparative example will be described.

FIG. 13 is a cross-sectional view illustrating a state in which the semiconductor device 10X according to the comparative example of FIGS. 3A and 3B is mounted on the substrate 20X. As illustrated in FIG. 13, the shapes of the first lead 12X and the inner first lead 12Xi of the semiconductor device 10X according to the comparative example are the same as the shapes of the first lead 12F and the inner first lead 12Fi of the seventh embodiment. However, the semiconductor device 10X according to the comparative example is different from the semiconductor device 10F according to the seventh embodiment in that the bottom surface of the inner first lead 12Xi is covered with a resin portion 11bX and not separated from the package part 11.

The length of the first landing 21X of the substrate 20X is made smaller than the length of the first landing 21F according to the seventh embodiment and the length of the first landing 21X more closely matches with the length of the first lead 12X.

The semiconductor device 10F according to the seventh embodiment may be prepared such that the opening OP1 is formed by removing the resin portion 11bX on the bottom surface 11b of the package part 11 in the semiconductor device 10X according to the comparative example so that the bottom surface of the inner first lead 12Xi is exposed. The method for removing the resin portion 11bX is not particularly limited and, for example, the resin portion may be removed by irradiation with laser.

As described above, since the bottom surfaces 12Fib1 and 12Fib2 of the inner first lead 12Fi may be soldered as well as the bottom surface 12Fb of the first lead 12F in the seventh embodiment, the soldering area of the first lead 12F may be increased. Accordingly, the joining strength between the solder 31F and the first lead 12F and the inner first lead 12Fi is increased. Therefore, the occurrence of cracks in the solder 31F may be suppressed. In some embodiments, the exposed bottom surface 12Fib2 is not soldered, thus allowing for that portion of the inner lead 12Fi to absorb stress, such as thermal stress causing expansion and contraction.

In addition, stress is dispersed in a direction perpendicular to an interface between the inner first lead 12Fi and the solder 31F in the solder 31F formed in the vicinity of the elevated bottom surface 12Fib1 of the inner first lead 12Fi and thus the occurrence of cracks in the solder 31F may be effectively suppressed.

Furthermore, since the semiconductor device 10F according to the seventh embodiment may be prepared by removing the resin portion 11bx covering the inner first lead 12Xi from the semiconductor device 10X according to the comparative example, no new die or the like needs to be prepared and thus the semiconductor device may be manufactured at a low cost.

The features of any of the various embodiments discussed above may be combined with features from the other embodiments unless there is an obstruction preventing such a combination. For example, the seventh embodiment may be combined with any one of the third to fifth embodiments. For example, the width of at least a part of the two first leads 12F positioned on the outermost sides among the first leads 12F may be wider than the width of other first leads 12F. Accordingly, the solder strength of the first lead 12F having a wider width may be further increased. Therefore, the occurrence of solder cracks in the soldered portion may be further suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a package part including a semiconductor element sealed with resin;
a plurality of first leads each having an outer portion that extends from a first side of the package part;
a plurality of second leads each having an outer portion that extends from a second side of the package part, the second side opposing the first side; and
a heat dissipation plate provided at a bottom surface of the package part and connected to at least one of the plurality of second leads, wherein
at least one of the outer portions of the plurality of first leads has a first width, along a direction parallel to the first side, that is wider than a second width, along a direction parallel to the second side, of at least one of the outer portions of the plurality of second leads.

2. The semiconductor device according to claim 1, wherein the plurality of first leads are disposed in a linear arrangement along the first side such that a first outer lead is disposed at a first end of the linear arrangement and a second outer lead is disposed at a second end of the linear arrangement, and the first outer lead and the second outer lead each include a part having the first width.

3. The semiconductor device according to claim 2, wherein the part of the first and second outer leads having the first width extends away from the other first leads in the plurality of first leads.

4. The semiconductor device according to claim 3, wherein a length of the outer portion of each first lead extending away from the first side is greater than a length of the outer portion of each second lead extending away from the second side.

5. The semiconductor device according to claim 2, wherein the first and second outer leads each extend from the first side to an outer end and have a constant width from the first side to the outer end.

6. The semiconductor device according to claim 1, wherein the at least one of the outer portions of the plurality of first leads having the first width includes an end portion having the first width and an extending portion between the end portion and the first side that has a width along the direction parallel to the first side that is less than the first width.

7. The semiconductor device according to claim 1, wherein the at least one of the outer portions of the plurality of first leads having the first width has a constant width.

8. The semiconductor device according to claim 1, wherein the at least one of the outer portions of the plurality of first leads having the first width includes a part that is adjacent to the first side and has the first width.

9. The semiconductor device according to claim 1, wherein the at least one of the outer portions of the plurality of first leads having the first width has a width along the direction parallel to the first side that is not constant.

10. The semiconductor device according to claim 1, wherein
the plurality of first leads are disposed in a linear arrangement along the first side such that a first outermost lead is disposed at a first end of the linear arrangement, and
the first outermost lead includes a first portion having the first width.

11. The semiconductor device according to claim 10, wherein the first outermost lead includes a second portion having a width in the direction parallel to the first side that is less than the first width.

12. The semiconductor device according to claim 10, wherein the first portion is directly adjacent to the first side.

13. The semiconductor device according to claim 10, wherein the first outermost lead has a constant width along its length from the first side.

14. A semiconductor device, comprising:
a semiconductor element;
a resin package sealing the semiconductor element;
a plurality of first leads extending along a first direction from a first side of the resin package;
a plurality of second leads extending from a second side of the resin package; and
a heat dissipation plate provided at a bottom surface of the resin package and connected to at least one of the plurality of second leads, wherein
at least one first lead in the plurality of first leads includes a first portion that is beyond the resin package in the first direction and has a first width in a second direction crossing the first direction, the first width being greater than a width in the second direction of at least one second lead in the plurality of second leads.

15. The semiconductor device according to claim 14, wherein the plurality of first leads are disposed in a linear arrangement along the first side such that a first outermost lead is disposed at a first end of the linear arrangement and a second outermost lead is disposed at a second end of the linear arrangement, and the first outermost lead and the second outermost lead each have a part having the first width.

16. The semiconductor device according to claim 15, wherein the first and second outermost leads each extend in the first direction from the first side to an outer end and have a constant width from the first side to the outer end.

17. The semiconductor device according to claim 14, wherein each first lead in the plurality of first leads has a length along the first direction from the first side to an outer end that is greater than a length of each second lead in the plurality of second leads along the first direction from the second side to an outer end.

18. The semiconductor device according to claim 14, wherein the first portion of the at least one first lead in the plurality of first leads includes an end part having the first width and an extending part between the end part and the first side that has a width in the second direction that is less than the first width.

19. The semiconductor device according to claim 14, wherein the at least one first lead in the plurality of first leads including the first portion has a width in the second direction which varies along its length in the first direction from the first side to an outer end.

20. The semiconductor device according to claim 14, wherein the at least one first lead in the plurality of first leads including the first portion has the first width along its entire length in the first direction from the first side to an outer end.

\* \* \* \* \*